United States Patent
Sarver

(10) Patent No.: US 8,375,889 B1
(45) Date of Patent: Feb. 19, 2013

(54) SYSTEM AND METHOD FOR PROVIDING AN IMPROVED SHUTTER FOR USE WITH A SHADOW TAB MASK

(75) Inventor: Roger Sarver, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1986 days.

(21) Appl. No.: 11/165,584

(22) Filed: Jun. 23, 2005

(51) Int. Cl.
*C23C 16/00* (2006.01)
*C23C 16/04* (2006.01)

(52) U.S. Cl. ........... 118/504; 118/723 VE; 118/723 EB; 118/715; 204/298.11

(58) Field of Classification Search ............... 118/500, 118/504, 728, 723 VE, 723 EB, 715; 204/298, 204/298.11
See application file for complete search history.

(56) References Cited

U.S. PATENT DOCUMENTS

| 5,456,756 A | 10/1995 | Ramaswami et al. |
| 6,277,198 B1* | 8/2001 | Yao et al. ....................... 118/503 |
| 6,929,724 B2* | 8/2005 | Green et al. .............. 204/298.11 |
| 2003/0209199 A1* | 11/2003 | Green et al. ............ 118/723 VE |
| 2010/0089315 A1* | 4/2010 | Brown et al. .................. 118/504 |

\* cited by examiner

*Primary Examiner* — Jeffrie R Lund
(74) *Attorney, Agent, or Firm* — Eugene C. Conser; Wade J. Brady, III; Frederick J. Telecky, Jr.

(57) ABSTRACT

A system and method is disclosed for providing an improved shutter for use with a shadow tab mask and heater table during a conditioning process for a physical vapor deposition (PVD) chamber. A shutter for covering the heater table is provided that has a circumferential flange with a thickness that is less than a thickness of the non-circumferential flange portions of the shutter. A shadow tab mask having a portion that extends over the flange portion is placed on the heater table. When deposition material is subsequently deposited, the reduced thickness of the flange portion prevents a fused seal from being formed between deposition material deposited on the shadow tab mask and deposition material deposited on the circumferential flange of the shutter.

16 Claims, 3 Drawing Sheets

SYSTEM AND METHOD FOR PROVIDING AN IMPROVED SHUTTER FOR USE WITH A SHADOW TAB MASK

TECHNICAL FIELD OF THE INVENTION

The present invention relates generally to the manufacture of integrated circuits and, more particularly, to a system and method for providing an improved shutter for use with a shadow tab mask and heater table during a conditioning process for a physical vapor deposition (PVD) chamber.

BACKGROUND OF THE INVENTION

A process that is commonly used during the manufacture of semiconductor integrated circuit wafers is known as physical vapor deposition (PVD). During a PVD process a metal layer is deposited on an underlying semiconductor wafer by a sputtering process.

Alignment marks on the surface of a semiconductor wafer are typically covered by a shadow tab mask structure in order to prevent the alignment marks from being covered by the metal that is deposited on the wafer during the metal deposition process. A shadow tab mask generally comprises a ring structure that is placed over the circumferential edge of a circular disk of a semiconductor wafer. The shadow tab mask is formed having a number of protrusions that extend from inner edge of the ring structure out over a portion of the surface of the semiconductor wafer when the shadow tab mask is placed over the semiconductor wafer. The location, size and extent of the protrusions (called "tabs") are such that the tabs cover the alignment marks on the semiconductor wafer when the shadow tab mask is properly aligned with respect to the semiconductor wafer. During a physical vapor deposition (PVD) process the metal that is sputtered over the tabs of the shadow tab mask does not reach the alignment marks that are covered by the tabs. An example of a prior art shadow table mask is described in U.S. Pat. No. 5,456,756.

A physical vapor deposition (PVD) chamber comprises a heater table over which a semiconductor wafer is placed during a PVD process. The heater table is used to heat the semiconductor wafer during the manufacturing process. When the PVD chamber is being prepared for operation a shutter in the form of a disk is temporarily placed over the heater table to protect the heater table from a deposition of Titanium (Ti)/Titanium Nitride (TiN) that is used to condition the PVD chamber.

When the shutter is not being used to shield the heater table from a deposition process, the shutter is kept in a shutter storage receptacle. The shutter is moved from the shutter storage receptacle into place over the heater table by a pneumatic arm. The pneumatic arm also replaces the shutter in the shutter storage receptacle when the shutter is not being used.

FIG. 1 is a block diagram 100 that illustrates a plan view of a prior art shadow tab mask 110. As may be seen in FIG. 1 the shadow tab mask 110 comprises a ring structure having an inner edge 120 and an outer edge 130. In the embodiment shown in FIG. 1 shadow tab mask 110 comprises two tabs 140. Tabs 140 extend inwardly from inner edge 120 so that the tabs 140 will cover alignment marks on a semiconductor wafer (not shown in FIG. 1) when the shadow tab mask 110 is properly aligned with respect to the semiconductor wafer.

FIG. 1 also shows the location of a disk shaped shutter 150 under the shadow tab mask 110. The dotted line 160 represents the outer edge of the shutter 150 under the shadow tab mask 110. The spatial relationship of shutter 150 with respect to shadow tab mask 110 may be more clearly understood by looking at a cross sectional view of shadow table mask 110 and shutter 150 taken along line A-A.

FIG. 2 is a block diagram 200 illustrating the cross sectional view of shadow tab mask 110 and shutter 150 taken along line A-A in FIG. 1. The shutter 150 is placed on the upper surface of heater table 210. Shadow tab mask 110 is placed on top of shutter 150. The two sets of slanted diagonal lines across shutter 150 and heater table 210 indicate that the dimension of the diameter shown in FIG. 2 is not drawn to scale.

FIG. 3 is an enlarged block diagram 300 of an end portion of the cross sectional view of the shadow tab mask 110 and shutter 150 shown in FIG. 2. When the physical vapor deposition (PVD) chamber is conditioned, a layer of Titanium (Ti)/Titanium Nitride (TiN) is deposited over the shadow tab mask 110 and shutter 150. The result of such a deposition process is shown in FIG. 4.

FIG. 4 is a block diagram 400 of the cross sectional view shown in FIG. 3 showing the result of depositing a layer of Titanium (Ti)/Titanium Nitride (TiN) over the shadow tab mask 110 and shutter 150. A deposited layer 410 of Titanium (Ti)/Titanium Nitride (TiN) material covers the exposed portions of the shadow tab mask 110 and a portion of the upper surface of shutter 150. The deposition of the layer 410 creates a fused seam 420 at the juncture of the shadow tab mask 110 and the shutter 150.

When the shadow tab mask 110 is subsequently lifted from the shutter 150, the fused seam 420 of layer 410 will be broken. The breaking of the fused seam 420 causes the explosive release of Titanium (Ti)/Titanium Nitride (TiN) particles throughout the PVD chamber. This causes the particle level to increase throughout the PVD chamber. This is one problem that occurs due to the interaction of shadow tab mask 110 and prior art shutter 150.

Note that because the shadow tab mask 110 is placed on the upper surface of shutter 150, the shadow tab mask 110 is elevated above the shutter 150 so that an undesirable gap 430 is created between the shadow tab mask 110 and the heater table 210. When the Titanium (Ti)/Titanium Nitride (TiN) particles are released throughout the PVD chamber (due to the breaking of the fused seam 420) some of the particles may enter into gap 430.

That is, particles from deposition layer 410 that are free to move throughout the PVD chamber may backscatter into gap 430 between the shadow tab mask 110 and the heater table 210. These particles then cover the surfaces of the inner cavity 440 between shadow tab mask 130 and heater table 210. To achieve better adhesion the surfaces of the inner cavity 440 are not conditioned with a rough texture. Therefore, the Titanium (Ti)/Titanium Nitride (TiN) particles become loosely bonded to the surfaces of the inner cavity 440 and are susceptible to flaking. This is a second problem that occurs due to the interaction of shadow tab mask 110 and prior art shutter 150.

The shadow tab mask 110 rests directly on shutter 150. Consider an embodiment of shadow tab mask 110 in which shadow tab mask 110 has two tabs 140 (as shown in FIG. 1). If the shadow tab mask 110 rests on the two tabs 140 there may be a balancing problem with shadow tab mask 110. This a third problem that may occur due to the interaction of shadow tab mask 110 and prior art shutter 150.

There is therefore a need in the art for a system and method for providing an improved shutter for use with a shadow tab mask and heater table during a conditioning process for a physical vapor deposition (PVD) chamber.

SUMMARY OF THE INVENTION

To address the above-discussed deficiencies of the prior art, it is a primary object of the present invention to provide an improved shutter for use with a shadow tab mask and heater table during a conditioning process for a physical vapor deposition (PVD) chamber.

The improved shutter of the present invention for covering a heater table in a physical vapor deposition (PVD) chamber has a circumferential flange with a thickness that is less than a thickness of the non-circumferential flange portions of the shutter. In one advantageous embodiment the thickness of the circumferential flange portion is approximately one half of the thickness of the non-circumferential flange portions of the shutter.

After the shutter has been placed on the heater table, a shadow tab mask is placed on the heater table. The shadow tab mask has a portion that extends over a portion of the circumferential flange. When deposition material is subsequently deposited on the shadow tab mask and the circumferential flange of the shutter, the reduced thickness of the circumferential flange portion prevents a fused seal from being formed between deposition material deposited on the shadow tab mask and deposition material deposited on the circumferential flange of the shutter. The absence of a fused seal of deposition material minimizes a dispersal of deposition particles into the physical vapor deposition (PVD) chamber when the shadow tab mask is subsequently removed from the heater table.

It is an object of the present invention to provide an improved shutter for use with a shadow tab mask and heater table during a conditioning process for a physical vapor deposition (PVD) chamber.

It is also an object of the present invention to provide a heater table shutter that has portions that form a circumferential flange that has a thickness that is less than a thickness of non-circumferential flange portions of the shutter.

It is yet another object of the invention to provide a heater table shutter that prevents formation of a fused seam of deposition material between deposition material that is deposited on a shadow tab mask and deposition material that is deposited on the circumferential flange of the heater table shutter.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
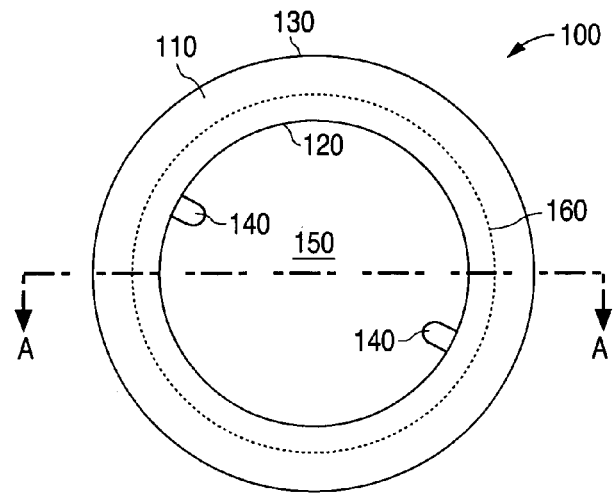
FIG. 1 is a block diagram illustrating a plan view of a prior art shadow tab mask placed over a prior art shutter.
Figure 2:
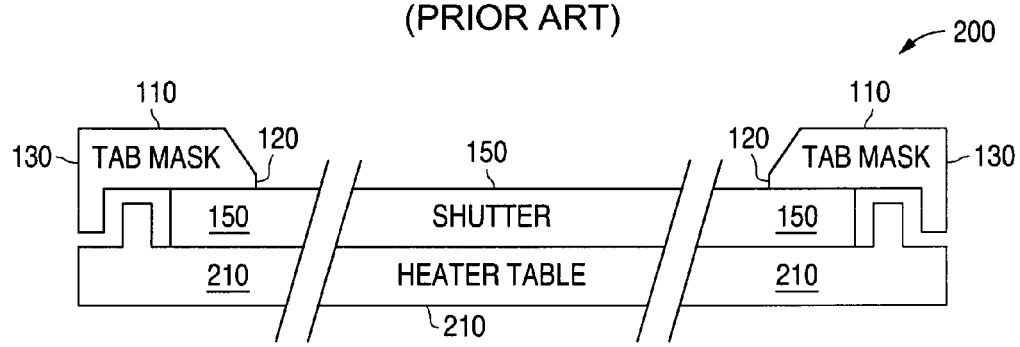
FIG. 2 is a block diagram illustrating a cross sectional view of the prior art shadow tab mask and shutter shown in FIG. 1 taken along line A-A.
Figure 3:
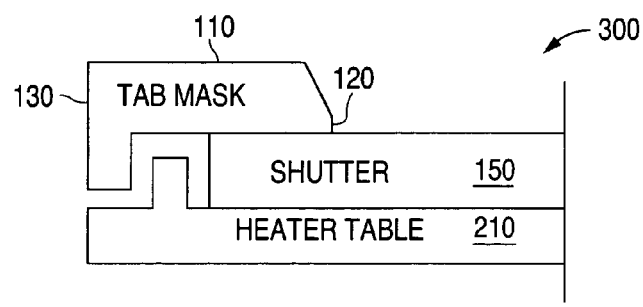
FIG. 3 is an enlarged block diagram of an end portion of the cross sectional view of the prior art shadow tab mask and shutter shown in FIG. 2.
Figure 4:
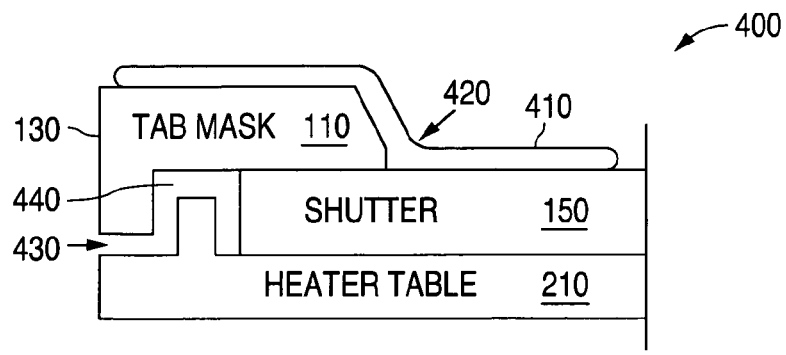
FIG. 4 is a block diagram of the cross sectional view shown in FIG. 3 showing the effect of depositing a layer of material comprising Titanium (Ti)/Titanium Nitride (TiN)
Figure 5:
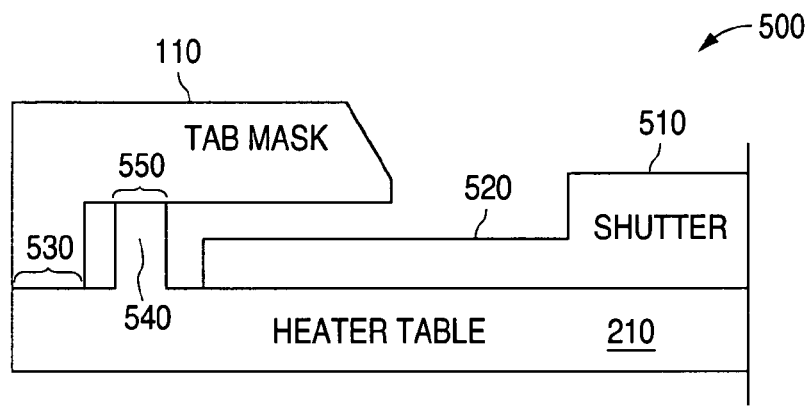
FIG. 5 is a block diagram of a cross sectional view of an advantageous embodiment of a shutter of the present invention and its spatial relationship to a prior art tab mask and heater table.
Figure 6:
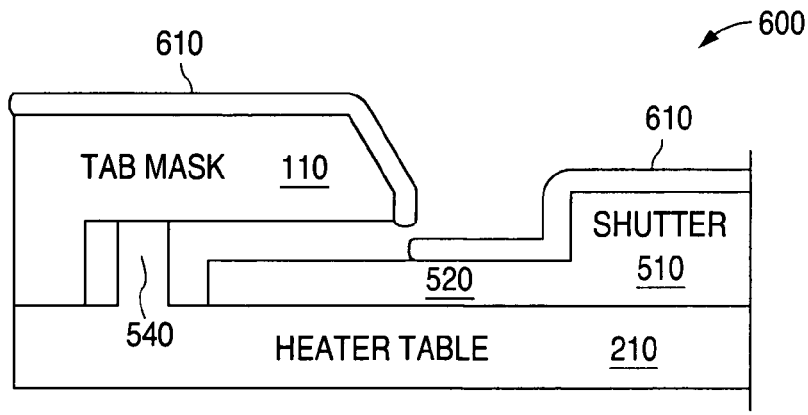
FIG. 6 is a block diagram of a cross sectional view of the advantageous embodiment of the shutter of the present invention shown in FIG. 5 showing the effect of depositing a layer of material comprising Titanium (Ti)/Titanium Nitride (TiN)
Figure 7:
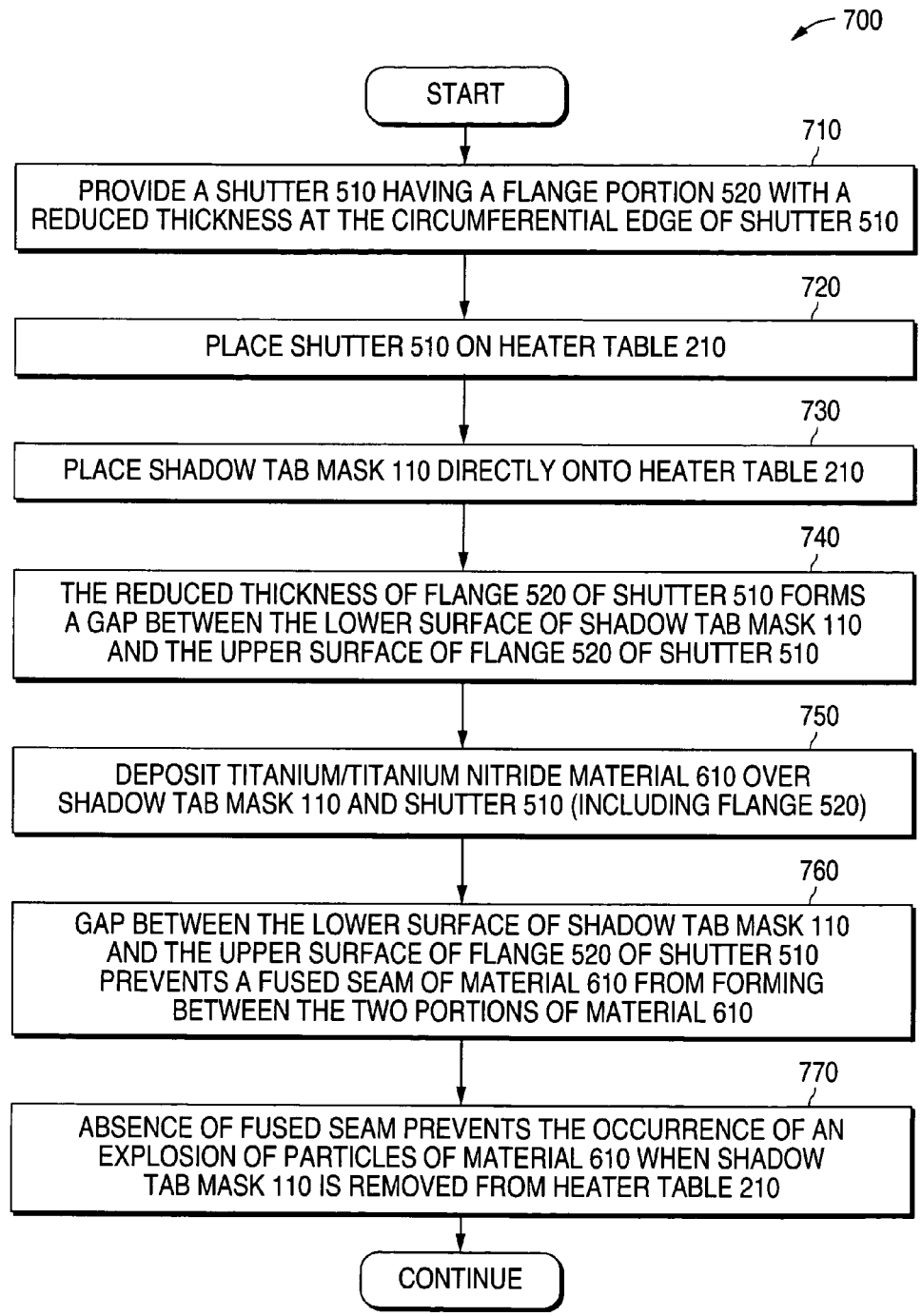
FIG. 7 is a flow chart showing the steps of an advantageous embodiment of a method of the present invention.

FIGS. 5 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged physical vapor deposition (PVD) chamber.

The present invention comprises a shutter that has a reduced thickness where the shutter interacts with the shadow tab mask. FIG. 5 is a block diagram 500 of a cross sectional view of an advantageous embodiment of shutter 510 of the present invention and its spatial relationship to prior art tab mask 110 and prior art heater table 210. Shutter 510 has a reduced thickness at its circumferential edge. The portion of shutter 510 that has a reduced thickness is designated with reference numeral 520. For convenience in description, the reduced thickness portion 520 of shutter 510 will be referred to as flange 520. In one advantageous embodiment, the thickness of flange 520 is one half of the thickness of shutter 510.

As shown in FIG. 5, the bottom surface of flange 520 rests on heater table 210. The reduced thickness of flange 520 means that there will be a gap between the lower surface of shadow tab mask 110 and the top surface of flange 520.

As also shown in FIG. 5, the lower surface of shadow tab mask 110 rests on heater table 210 at two locations. The juncture between shadow tab mask 110 and heater table 210 at the first location is designated with reference numeral 530. The juncture between shadow tab mask 110 and support structure 540 of heater table 210 at the second location is designated with reference numeral 550. The thickness of support structure 540 of heater table 210 determines the size of the gap between the lower surface of shadow tab mask 110 and the top surface of flange 520.

FIG. 6 is a block diagram 600 of a cross sectional view of the advantageous embodiment of shutter 510 of the present invention showing the effect of depositing a layer of material 610 comprising Titanium (Ti)/Titanium Nitride (TiN). The gap between the upper surface of flange 520 and the lower surface of shadow tab mask 110 ensures that (unlike the prior art case) there is no fused seam between the portion of the material deposited over the shadow tab mask 110 and the portion of the material deposited over the flange 520 (and other portions of shutter 510).

The reduced thickness of flange 520 of shutter 510 eliminates the possibility of a fused seam forming between the two portions of material 610. The dimension of the reduced thickness of flange 520 is selected so that the formation of a fused seal between the two portions of material 610 will not occur.

When the shadow tab mask 110 is subsequently lifted from the shutter 510, the absence of a fused seam at the site of flange 520 means that there will be no explosive release of Titanium (Ti) particles/Titanium Nitride (TiN) particles throughout the PVD chamber. In this manner flange 520 of shutter 510 solves the first problem that occurs in the interaction of a shadow tab mask and a prior art shutter.

Because the lower surface of shadow tab mask 110 rests on heater table 210 at juncture 530 and at juncture 550, there is no gap between shadow tab mask 110 and heater table 210 at juncture 530. The prior art shutter 150 created a gap 430 that connected to an inner cavity 440 between shadow tab mask 110 and heater table 210. The use of flange 520 of shutter 510 of the present invention ensures that no such gap will exist.

The absence of a gap means that there will be no backscatter of particles into a gap (or into an inner cavity) between the shadow tab mask 110 and the heater table 210. In this manner flange 520 of shutter 510 solves the second problem that occurs in the interaction of a shadow tab mask and a prior art shutter.

In the prior art case (using prior art shutter 150), if the shadow tab mask 110 rested on the two tabs 140 there could be a balancing problem with shadow tab mask 110. In the present invention (using flange 520 of shutter 510) there is no longer any possibility of a balancing problem because the shadow tab mask 110 rests directly on heater table 210. In this manner flange 520 of shutter 510 solves the third problem that occurs in the interaction of a shadow tab mask and a prior art shutter.

FIG. 7 is a flow chart 700 showing the steps of an advantageous embodiment of a method of the present invention. In the first step of the method a shutter 510 is provided that has a flange portion 520 having a reduced thickness at the circumferential edge of shutter 510 (step 710).

Then shutter 510 is placed on heater table 210 (step 720). Then shadow tab mask 110 is placed directly onto heater table 210 (step 730). The reduced thickness of flange 520 of shutter 510 forms a gap between the lower surface of shadow tab mask 110 and the upper surface of flange 520 of shutter 510 (step 740).

Then Titanium/Titanium Nitride material 610 is deposited over shadow tab mask 110 and shutter 510 (including flange 520) (step 750). The gap between the lower surface of shadow tab mask 110 and the upper surface of flange 520 of shutter 510 prevents a fused seam of material 610 from forming between the two portions of material 610 (step 760). The absence of a fused seam prevents the occurrence of an explosion of particles of material 610 when shadow tab mask 110 is removed from heater table 210 (step 770).

Although the present invention has been described with several embodiments, various changes and modifications may be suggested to one skilled in the art. It is intended that the present invention encompass such changes and modifications as fall within the scope of the appended claims.

What is claimed is:

1. An apparatus for use with a heater table in a physical vapor deposition chamber, wherein said apparatus comprises:
   a shutter that has portions that form an outer circumferential flange of said shutter that has a thickness that is less than a thickness of non-circumferential flange portions of said shutter.

2. The apparatus as set forth in claim 1 wherein said thickness of said outer circumferential flange of said shutter is approximately one half of said thickness of non-circumferential flange portions of said shutter.

3. The apparatus as set forth in claim 1 further comprising:
   a shadow tab mask that is capable of being placed on said heater table, said shadow tab mask having a portion that extends over a portion of said outer circumferential flange of said shutter when said shutter and said shadow tab mask are placed on said heater table.

4. The apparatus as set forth in claim 3 wherein a lower surface of said portion of said shadow tab mask that extends over said portion of said outer circumferential flange of said shutter is located at a distance above an upper surface of said outer circumference flange of said shutter.

5. The apparatus as set forth in claim 4 wherein said distance is determined by a thickness of a support structure of said heater table.

6. The apparatus as set forth in claim 5 wherein said thickness of said support structure of said heater table enables said shadow tab mask to be seated on said heater table thereby preventing creation of a gap between said shadow tab mask and said heater table.

7. The apparatus as set forth in claim 4 wherein said distance prevents a formation of a fused seam of deposition material between a first portion of deposition material deposited on said shadow tab mask and a second portion of deposition material deposited on said outer circumferential flange of said shutter.

8. The apparatus as set forth in claim 7 wherein said deposition material is one of: titanium and titanium nitride.

9. A physical vapor deposition chamber comprising:
   a heater table; and
   a shutter for covering said heater table, said shutter having portions that form an outer circumferential flange of said shutter that has a thickness that is less than a thickness of non-circumferential flange portions of said shutter.

10. The physical vapor deposition chamber as set forth in claim 9 wherein said thickness of said outer circumferential flange of said shutter is approximately one half of said thickness of non-circumferential flange portions of said shutter.

11. The physical vapor deposition chamber as set forth in claim 9 further comprising:
    a shadow tab mask that is capable of being placed on said heater table, said shadow tab mask having a portion that extends over a portion of said outer circumferential flange of said shutter when said shutter and said shadow tab mask are placed on said heater table.

12. The physical vapor deposition chamber as set forth in claim 11 wherein a lower surface of said portion of said shadow tab mask that extends over said portion of said outer circumferential flange of said shutter is located at a distance above an upper surface of said outer circumference flange of said shutter.

13. The physical vapor deposition chamber as set forth in claim 12 wherein said distance is determined by a thickness of a support structure of said heater table.

14. The physical vapor deposition chamber as set forth in claim 13 wherein said thickness of said support structure of said heater table enables said shadow tab mask to be seated on said heater table thereby preventing creation of a gap between said shadow tab mask and said heater table.

15. The physical vapor deposition chamber as set forth in claim 12 wherein said distance prevents a formation of a fused seam of deposition material between a first portion of deposition material deposited on said shadow tab mask and a second portion of deposition material deposited on said outer circumferential flange of said shutter.

16. The physical vapor deposition chamber as set forth in claim 15 wherein said deposition material is one of: titanium and titanium nitride.

* * * * *